United States Patent
Agarwal (10) Patent No.: US 7,667,502 B2
(45) Date of Patent: Feb. 23, 2010

(54) LOW VOLTAGE DIFFERENTIAL SIGNALLING DRIVER WITH PRE-EMPHASIS

(75) Inventor: Prabhat Agarwal, Howrah (IN)

(73) Assignee: Infineon Technologies AG, Neubiberg (DE)

( * ) Notice: Subject to any disclaimer, the term of this patent is extended or adjusted under 35 U.S.C. 154(b) by 124 days.

(21) Appl. No.: 12/092,556

(22) PCT Filed: Nov. 4, 2005

(86) PCT No.: PCT/SG2005/000377

§ 371 (c)(1),
(2), (4) Date: May 2, 2008

(87) PCT Pub. No.: WO2007/053111

PCT Pub. Date: May 10, 2007

(65) Prior Publication Data

US 2009/0045852 A1    Feb. 19, 2009

(51) Int. Cl.
H03K 3/00    (2006.01)
(52) U.S. Cl. ...................... 327/108; 327/112
(58) Field of Classification Search ............... 327/108, 327/109, 112; 326/62, 82
See application file for complete search history.

(56) References Cited

U.S. PATENT DOCUMENTS

| 6,246,870 B1 | 6/2001 | Dent et al. |
| 6,281,715 B1 * | 8/2001 | DeClue et al. ........... 327/65 |
| 6,288,581 B1 | 9/2001 | Wong |
| 6,646,482 B2 * | 11/2003 | Takeuchi ................ 327/112 |
| 7,256,626 B2 * | 8/2007 | Nguyen et al. ........... 327/112 |
| 7,408,387 B2 * | 8/2008 | Suenaga .................. 327/108 |
| 2003/0085736 A1 | 5/2003 | Tinsley et al. |
| 2004/0124888 A1 | 7/2004 | Radelinow |

* cited by examiner

Primary Examiner—Hai L Nguyen
(74) Attorney, Agent, or Firm—Lee & Hayes, PLLC (57) ABSTRACT

There is provided a LVDS driver arranged to receive an input signal which switches between two voltage levels. The driver comprises a pre-emphasis block (405) for generating a pre-emphasis signal having a first voltage level for a time period T1 after each switch of the input signal, and a second voltage level at all other times, a differential pair of outputs for generating a differential output voltage across a load resistor (RI); and a driver circuit (401) comprising two parallel branches, each branch being connected to one output and each branch being arranged to receive the pre-emphasis signal. The driver is arranged so that the total current flowing through the driver circuit is constant, and during time period T1, the total current flowing through the driver circuit flows through the load resistor, thereby producing a differential output voltage and at all other times, only some of the total current flowing through the driver circuit flows through the load resistor, thereby reducing the differential output voltage.

12 Claims, 6 Drawing Sheets

FIG 5B

LOW VOLTAGE DIFFERENTIAL SIGNALLING DRIVER WITH PRE-EMPHASIS

FIELD OF THE INVENTION

The invention relates to a Low Voltage Differential Signalling (LVDS) driver for generating a differential output voltage with pre-emphasis and a method for generating a differential output voltage with pre-emphasis.

BACKGROUND OF THE INVENTION

Low Voltage Differential Signalling (LVDS) is a method for high-speed transmission of data over a copper transmission line. In LVDS, the difference in voltage levels between two signal lines forms the transmitted signal. In this way, the effects of noise are substantially reduced. Therefore, LVDS is commonly used for data transmission rates greater than around 100 Mbps over long distances.

Figure 1:
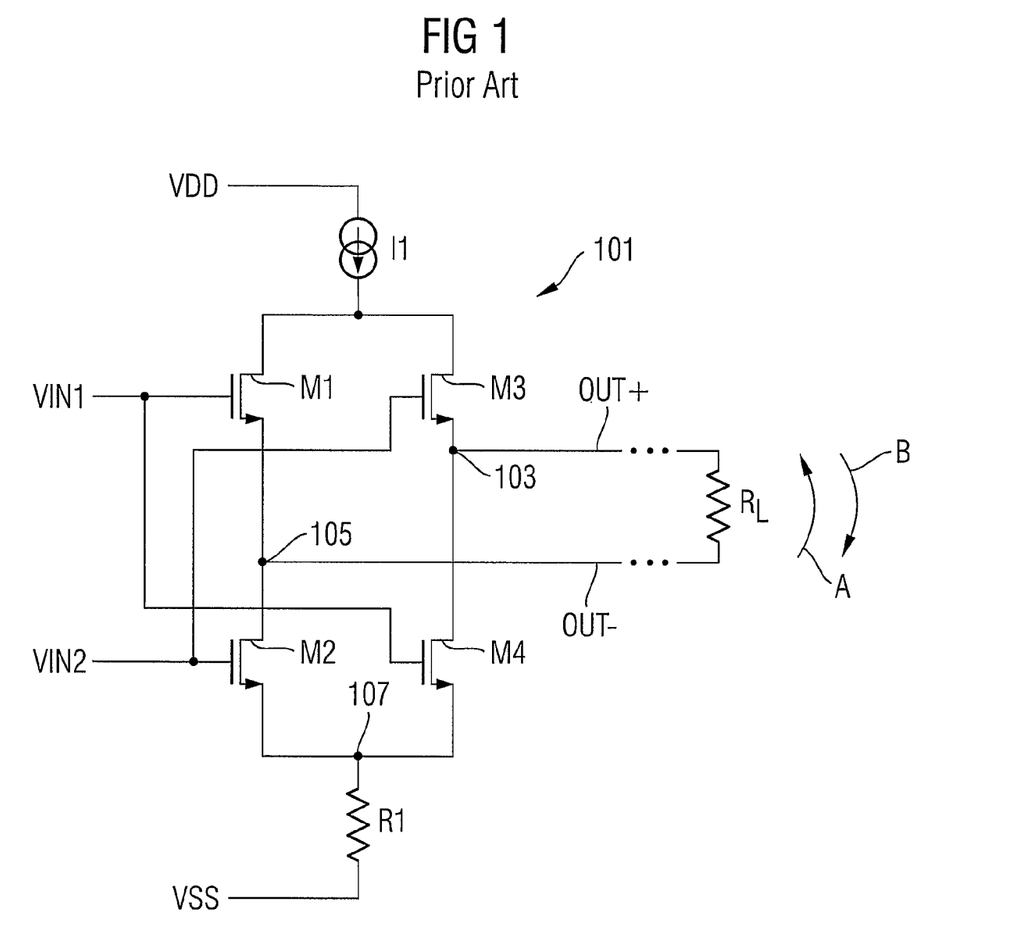
FIG. 1 is a diagram of a known LVDS driver circuit without pre-emphasis.

FIG. 1 shows an example of a conventional LVDS driver circuit 101. The difference in output signals OUT+ and OUT− on the output terminals 103 and 105 forms the pair of differential signals. The driver circuit 101 includes a DC (direct current) constant current source I1, coupled to voltage supply VDD, four NMOS (n-channel metal oxide semiconductor) switches M1, M2, M3 and M4 and a resistor R1 coupled between the node 107 and voltage supply VSS. The four NMOS switches M1, M2, M3 and M4 are controlled by input voltage signals VIN1 and VIN2 (M1 and M4 receiving input VIN1 and M2 and M3 receiving input VIN2) and direct current through load resistor $R_L$ as indicated by the arrows A and B.

In operation, two of the four NMOS switches turn on at a time to steer the current from current source I1 to generate a voltage across $R_L$. To steer current through $R_L$ in the direction shown by arrow B, input signal VIN2 goes high, switching on M2 and M3. At this time, input signal VIN1 goes low to keep M1 and M4 off. To steer current through $R_L$ in the direction shown by arrow A, input signal VIN1 goes high, switching on M1 and M4. At this time, input signal VIN2 goes low to keep M2 and M3 off.

The circuit shown in FIG. 1 can work well at low frequencies. However, the output switching current is limited by the DC constant current source I1. Since the switching speed of the LVDS driver circuit 101 is proportional to the amount of drive current from current source I1, this means a low switching speed of the LVDS driver circuit 101. This reduces the amplitude of the differential output voltage swing at high frequencies and causes disturbances such as noise, when the driver drives a heavy-load, such as a long cable.

One way to solve this problem is to introduce pre-emphasis into the LVDS driver and this is described in U.S. Pat. No. 6,281,715B1, U.S. Pat. No. 6,288,581B1 and US2004/0124888A1. With pre-emphasis, the differential voltage swing during signal transition is higher than the usual swing for a small proportion of the LVDS clock and becomes stable again for the remainder of the pulse duration. This pre-emphasis pulse compensates for signal degradation (produced by transmission over a long cable for example). For example, the voltage swing may be from 250 mV to around 900 mV for about ⅐ of each LVDS clock cycle and from around 250 mV to around 450 mV for the remainder of each clock cycle.

Figure 2:
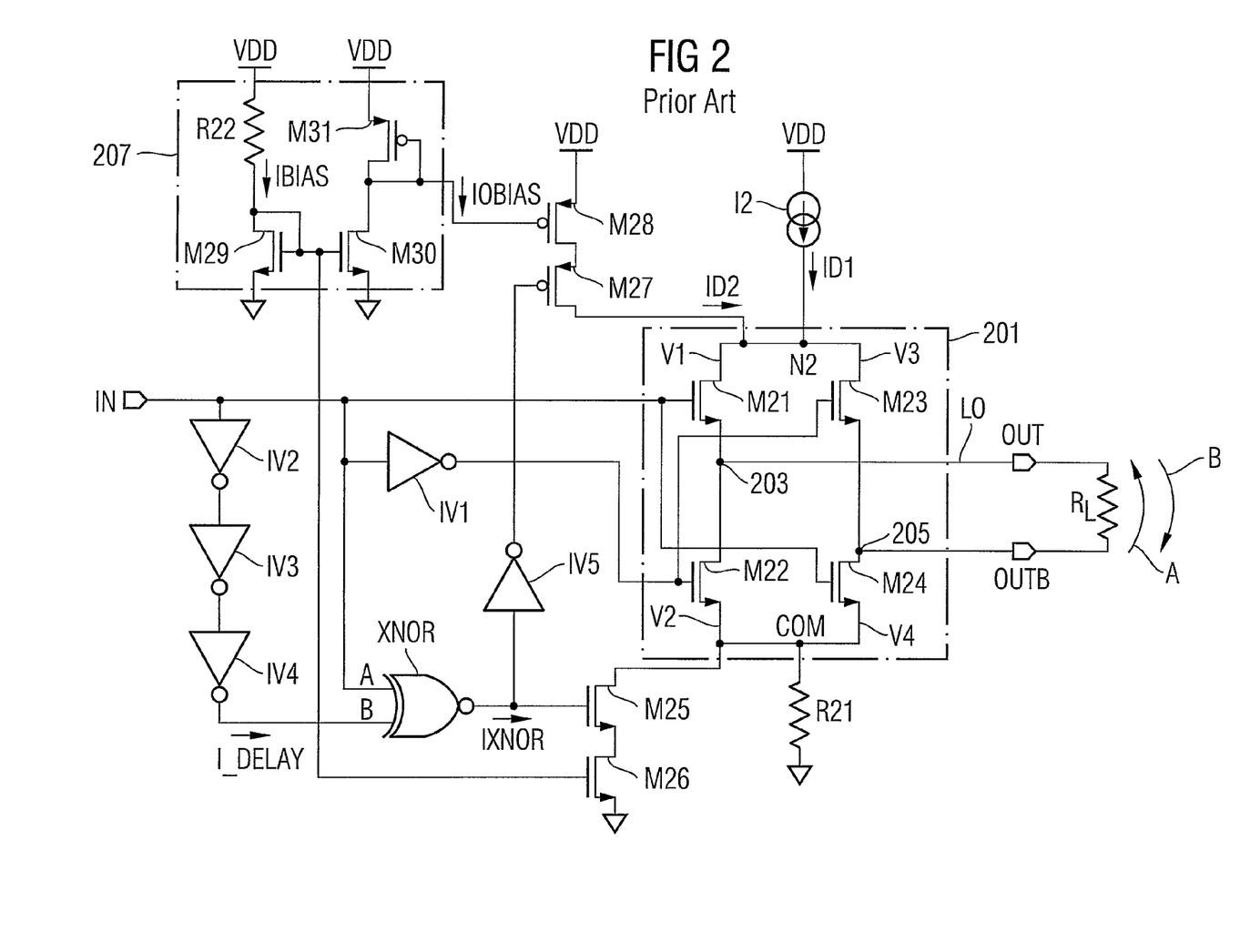
FIG. 2 is a diagram of a known LVDS driver circuit with pre-emphasis.

FIG. 2 shows the driver circuit of U.S. Pat. No. 6,281,715B1. The arrangement includes a current steering circuit 201 (similar to the traditional driver circuit of FIG. 1) together with a pre-emphasis circuit to increase the drive capability of the driver circuit. The pre-emphasis circuit includes transistors M25, M26, M27 and M28, inverters IV2, IV3, IV4 and IV5 and an exclusive-NOR gate XNOR. A truth table for XOR and XNOR is shown below:

TABLE 1

| Input a | Input b | XOR | XNOR |
| --- | --- | --- | --- |
| 0 | 0 | 0 | 1 |
| 0 | 1 | 1 | 0 |
| 1 | 0 | 1 | 0 |
| I | 1 | 0 | 1 |

Thus, it would seem that, due to inverters IV2, IV3 and IV4, the signal level at input A of exclusive-NOR gate XNOR would always be opposite to that of input B (which would always provide a zero output). However, the inverters IV2, IV3 and IV4 provide delay matching. Thus, it takes longer for the input signal IN travelling through inverters IV2, IV3 and IV4 to arrive at input B than it does for the input signal IN to arrive at input A. Because of this, inputs A and B of XNOR gate receive signals having the same signal level for a brief time during each switching transition of switches M21 to M24. When this happens, the output of XNOR is high, thereby switching on transistors M25 and M27.

Figure 3:
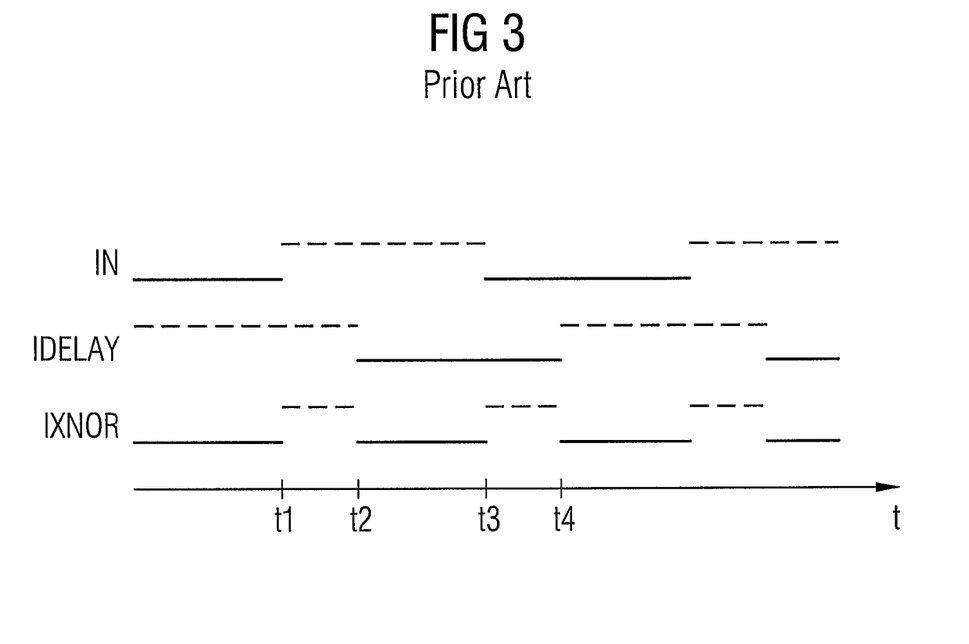
FIG. 3 is a simplified timing diagram of the IN, IDELAY and IXNOR signals of FIG. 2.

FIG. 3 shows a simplified timing diagram of the signalling in FIG. 2. FIG. 3 shows the signals IN (input signal), IDELAY (output of inverter IV4) and IXNOR (output of XNOR) with respect to time. As can be seen in FIG. 3, between t1 and t2 and between t3 and t4, IN and IDELAY are equal, producing a high output IXNOR. The periods between t1 and t2 and between t3 and t4 correspond to the pre-emphasis pulse.

Thus, in the arrangement of U.S. Pat. No. 6,281,715 B1, illustrated in FIGS. 2 and 3, and also in other known arrangements, an additional current pulse is injected into the driver stage during signal transition and this meets the pre-emphasis requirements. However, the arrangement involves switching the current sources with every transition which causes a lot of switching noise to the neighbouring bias circuitry. This is even more of a problem when a common mode feedback circuit is implemented in the LVDS driver stage.

SUMMARY OF THE INVENTION

It is an object of the invention to provide a LVDS driver and a method for generating an output differential voltage, which mitigate or substantially overcome the problems of known arrangements described above.

According to a first aspect of the invention, there is provided a Low Voltage Differential Signalling (LVDS) driver arranged to receive an input signal which switches between 1 and 0 voltage levels, the driver comprising:
- a pre-emphasis block for generating a pre-emphasis signal, the pre-emphasis signal having a first voltage level for a time period T1 after each switch of the input signal from 1 to 0 or from 0 to 1, and a second voltage level at all other times;
- a differential pair of outputs for generating a differential output voltage across a load resistor;
- a driver circuit comprising two parallel branches, each branch being connected to one output of the differential pair of outputs and each branch being arranged to receive the pre-emphasis signal, wherein the LVDS driver is arranged such that
the total current flowing through the driver circuit is constant, and during time period T1, the total current flowing through the driver circuit flows through the load resistor, thereby producing a differential output voltage across the differential pair of outputs, and at all other times, only some of the total current flowing through the driver circuit flows through the load resistor, thereby reducing the differential output voltage across the differential pair of outputs.

Because the current flowing through the load resistor (and hence the differential output voltage across the load resistor) is greater during T1 than at all other times, this produces the required pre-emphasis pulse in the differential output voltage. However, because the total current through the driver is constant at all times, with some of the current being diverted away from the load resistor during non-pre-emphasis pulse periods, the problem of switching noise is minimised.

In one embodiment, the pre-emphasis block comprises: a delay circuit arranged to receive the input signal and generate a delayed input signal; and a logic circuit coupled to the delay circuit and arranged to receive the input signal and the delayed input signal, the output of the logic circuit being the pre-emphasis signal having a first voltage level for a time period T1 after each switch of the input signal from 1 to 0 or from 0 to 1, and a second voltage level at all other times.

In that embodiment, the logic circuit may comprise an exclusive-OR circuit. Alternatively, the logic circuit may comprise an exclusive-NOR circuit.

In that embodiment, the delay circuit may comprise a plurality of inverters.

If an exclusive-OR circuit is used in the logic circuit, typically the plurality of inverters will comprise an odd number of inverters whereas, if an exclusive-NOR circuit is used in the logic circuit, typically the plurality of inverters will comprise an even number of inverters.

The number of inverters can be chosen appropriately for the desired delay in the delay block. The amount of delay in the delay block will determine the time period T1 and hence determine what proportion is T1 of each clock cycle of the input signal.

In one arrangement, the delay circuit comprises three inverters and the logic circuit comprises an exclusive-OR circuit. This arrangement means that, for a time period T1 after each switch of the input signal, the output of the delay block (which is the pre-emphasis signal) is 0 and at all other times, the output of the delay block is 1.

In one embodiment, during time period T1, the total current flowing through the driver circuit flows from the operational branch of the driver circuit, through the load resistor, to the non-operational branch of the driver circuit.

In that embodiment, preferably, at all other times, some of total current flowing through the driver circuit flows from the operational branch of the driver circuit, through the load resistor, to the non-operational branch of the driver circuit, and the remaining current flows through the non-operational branch of the driver circuit, bypassing the load resistor.

Thus, during T1 all the current flows through the load resistor whereas, at all other times, some current flows through the non-operational branch only, thereby bypassing the load resistor.

In one arrangement, one branch is operational when the input signal is 1 and the other branch is operational when the input signal is 0. Thus, as the input signal switches between 0 and 1, the two branches of the driver circuit alternate as the operational branch.

Preferably, each branch of the driver circuit comprises a first resistive element in parallel with a second resistive element.

In one embodiment, the first resistive element in each branch is a transistor. The first resistive element in each branch may be a PMOS transistor. In one embodiment, the second resistive element in each branch is a transistor.

The second resistive element in each branch is preferably controlled by the pre-emphasis signal, such that, during T1, the second resistive element in each branch is switched off and, at all other times, the second resistive element in each branch is switched on.

In one embodiment, each branch of the driver circuit comprises a third resistive element in series with the parallel first and second resistive elements. In one case, the third resistive element in each branch is a transistor. The third resistive element in each branch may be a NMOS transistor.

The third resistive element in the first branch is preferably controlled by the input signal and the third resistive element in the second branch is preferably controlled by a signal directly out of phase with the input signal.

Thus, during T1, only the operational branch is switched on. Thus, all the current flows through the operational branch to the load resistor and through the third resistive element of the non-operational branch. At all other times, the operational branch is switched on, but the second resistive element in the non-operational branch is also switched on. Thus, some current is able to flow through the second resistive element in the non-operational branch; that current is diverted away from the load resistor which means that the output differential voltage is reduced as compared with the output differential voltage during T1.

If the second resistive element is a transistor, the pre-emphasis signal generated by the delay block may be input to the gate of the transistor so that the transistor will switch on or off depending on whether the pre-emphasis signal is 1 or 0.

The first resistive element in the first branch is preferably controlled by the input signal and the first resistive element in the second branch is preferably controlled by a signal directly out of phase with the input signal.

Thus, when the input signal is 1, the first resistive element in the first branch is on and the first resistive element in the second branch is off. When the input signal is 0, the first resistive element in the first branch is off and the first resistive element in the second branch is on.

The driver circuit may further comprise a constant current source coupled to a voltage supply. The total current through both branches (which may be the constant current supplied by the constant current source) is constant.

In one arrangement, the third resistive element is coupled between the one output of the differential pair of outputs and ground and the two parallel resistive elements are coupled between the one output of the differential pair of outputs and the constant current source.

According to a second aspect of the invention, there is provided a method for generating a differential output voltage corresponding to an input signal, which switches between 1 and 0 voltage levels, but including a pre-emphasis pulse after each switch of the input signal from 1 to 0 or from 0 to 1, the method comprising the steps of:

generating a pre-emphasis signal having a first voltage level for a time period T1 after each switch of the input signal from 1 to 0 or from 0 to 1, and a second voltage level at all other times;

providing a differential pair of outputs for generating a differential output voltage;

providing a driver circuit comprising two branches in parallel, each branch being connected to one output of the differential pair of outputs and each branch being arranged to receive the pre-emphasis signal;

controlling the current flowing through the driver circuit such that the total current flowing through the driver circuit is constant, and during time period T1, the total current flowing through the driver circuit flows through the load resistor, thereby producing a differential output voltage across the differential pair of outputs, and at all other times, only some of the total current flowing through the driver circuit flows through the load resistor, thereby reducing the differential output voltage across the differential pair of outputs;

outputting a differential output voltage on the differential pair of outputs, the differential output voltage corresponding to the input signal but including a pre-emphasis pulse after each switch of the input signal from 1 to 0 or from 0 to 1.

Features described in relation to the first aspect of the invention may also be applicable to the second aspect of the invention and features described in relation to the second aspect of the invention may also be applicable to the first aspect of the invention.

BRIEF DESCRIPTION OF THE DRAWINGS

Known arrangements have already been described with reference to accompanying FIGS. 1 to 3, of which.

Exemplary embodiments of the invention will now be described with reference to accompanying FIGS. 4 and 5, of which.

DETAILED DESCRIPTION OF PREFERRED EMBODIMENTS

Figure 4:
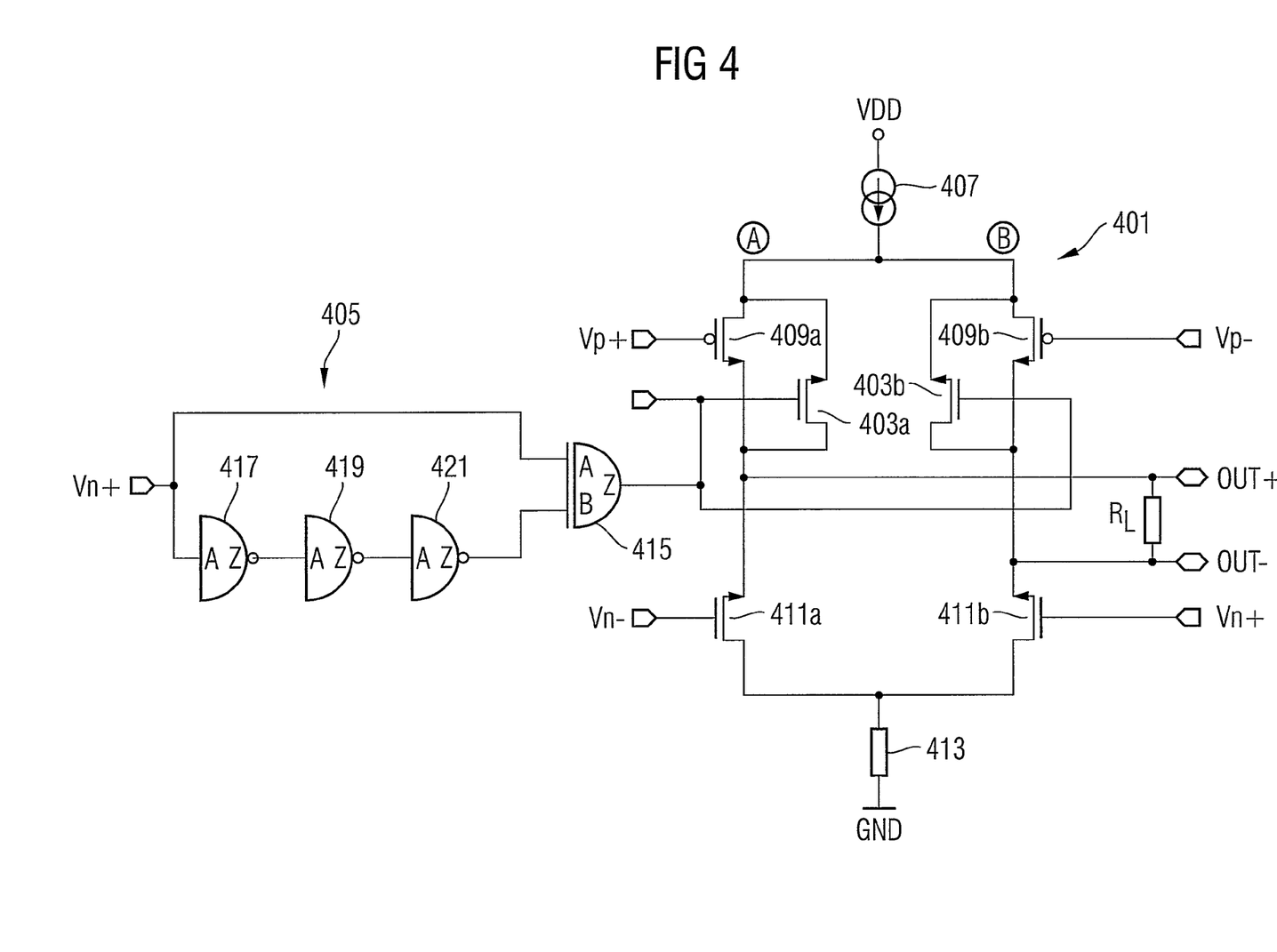
FIG. 4 is a diagram of a LVDS driver circuit according to one embodiment of the invention.

FIG. 4 shows a LVDS driver circuit according to one embodiment of the invention. The circuit includes a LVDS driver circuit with a current source (shown by reference numeral 401), two elements acting as resistors to control the current division (shown as 403a and 403b) and a delay block to generate the pre-emphasis pulse (shown by reference numeral 405).

The LVDS driver circuit 401 includes a DC constant current source 407 coupled to voltage supply VDD, two PMOS (p-channel metal oxide semiconductor) switches 409a and 409b, two NMOS (n-channel metal oxide semiconductor) switches 411a and 411b and a resistor 413 coupled to ground. PMOS 409a and NMOS 411a are in branch A of the driver circuit and PMOS 409b and NMOS 411b are in branch B of the driver circuit. PMOS 409a is controlled by input Vp+, PMOS 409b is controlled by input Vp− (which always has the opposite signal level to Vp+), NMOS 411a is controlled by input Vn− and NMOS 411b is controlled by input Vn+ (which always has the opposite signal level to Vn−). The difference in output signals OUT+ and OUT− (output differential voltage $V_{OD}$) forms the pair of differential signals.

The LVDS driver circuit also includes two elements acting as resistors to control the current division between branches A and B. Resistor 403a is in branch A and is parallel to PMOS 409a and resistor 403b is in branch B and is parallel to PMOS 409b. Both resistors 403a and 403b are controlled by input signal pre_em_plse, which will be described below. In FIG. 4, the resistors 403a and 403b are shown as transistors but it should be appreciated that any resistive elements that can be switched on and off by an external signal could be substituted.

The delay block 405 provides the pre-emphasis pulse and operates in a similar way to that described in relation to FIG. 2 (except that the gate is XOR rather than XNOR). Delay block 405 includes input Vn+ (which is the signal to be transmitted by the LVDS driver but with pre-emphasis) leading to two inputs A and B to XOR gate 415. Input Vn+ is connected directly to input A and input Vn+ is connected to input B via inverters 417, 419, 421. Thus, inverters 417, 419 and 421 provide delay to the input signal B relative to input signal A, thus providing the necessary pre-emphasis pulse. (Three inverters are shown in FIG. 4 but it should be understood that an appropriate number of inverters could be used to control the delay and hence the proportion of each cycle which is the pre-emphasis pulse. If an odd number of inverters are used, an XOR gate should be used whereas if an even number of inverters are used, an XNOR gate should be used.) The output of XOR gate 415 controls resistors 403a and 403b.

A general description of operation of the arrangement of FIG. 4 will now be given. After a transition of input Vn+, the output of XOR gate 415 (which is the pre_em_plse signal) is low for a small duration T1 and this results in a pre-emphasis pulse. After the small duration T1, the output of XOR gate returns to high. This works in exactly the same way as the arrangement of FIG. 2 except for the fact that the gate is XOR (rather than XNOR) so that pre_em_plse is high for most of the cycle but low for only a small portion of each cycle. When signal pre_em_plse is high, this switches on elements 403a and 403b. This affects the current actually flowing through the load resist (and hence the output voltage VOD) because the current is now split between the two branches.

A more detailed description of operation of the FIG. 4 arrangement will now be given. We can divide the description into two sections: when the pre_em_plse is low (immediately after each transition) and when the pre_em_plse is high (for the remainder of the clock).

When the pre_em_plse is low, elements 403a and 403b are off. If Vp+ is low, branch A is switched on. Thus, the entire current from current source 407 flows through PMOS 409a, through load resistor $R_L$ and through NMOS 411b. This creates a voltage drop between OUT++(high) and OUT− (low). On the other hand, if Vp− is low, branch B is switched on. Thus, the entire current from current source 407 flows through PMOS 409b, through load resistor $R_L$ and through NMOS 411a. This creates a voltage drop between OUT− (high) and OUT+ (low). Thus, when the pre_em_plse is low, the current from current source 407 flows either entirely through branch A or entirely through branch B, depending on which branch is operational.

When the pre_em_plse is high, the elements 403a and 403b are now switched on. If Vp+ is low, branch A is switched on so PMOS 409a, element 403a and element 403b are all on. Thus, the current is split between branch A (flowing through PMOS 409a and element 403a, in parallel, load resistor RL and NMOS 411b) and branch B (flowing through element 403b and NMOS 411b). Thus, the actual current through load resistor $R_L$ is reduced so there is a voltage drop produced between OUT+ (high) and OUT− (low) but this voltage drop is less than during the pre-emphasis pulse because part of the current passes through branch B, thereby bypassing load resistor $R_L$. Similarly, if Vp− is low, branch B is switched on so PMOS 409b, element 403b and element 403a are all on. Thus, the current is split between branch B (flowing through PMOS 409b and element 403b, in parallel, load resistor RL and NMOS 411a) and branch A (flowing through element 403a and NMOS 411a). Thus, the actual current through load resistor RL is reduced so there is a voltage drop between OUT− (high) and OUT+ (low) but this voltage drop is less than during the pre-emphasis pulse because part of the current passes through branch A, thereby bypassing load resistor $R_L$.

Thus, when the pre_em_plse is high, the output differential voltage VOD is reduced because the current from current source 407 does not pass entirely through either branch A or branch B, but is split between the two branches. The amount of current through A against the amount of current through B, and hence the actual voltage drop between OUT+ and OUT−, will depend on the values of the resistive elements 403a and 403b.

FIG. 5 is a timing diagram of various signals in the arrangement of FIG. 4. In FIG. 5(a), the Vn+ and Vn− signals are shown. In FIG. 5(b), the output differential voltage $V_{OD}$ is shown. In FIG. 5(c), the OUT+ and OUT− signals are shown. In FIG. 5(d), the pre_em_plse signal is shown.

Figure 5A:
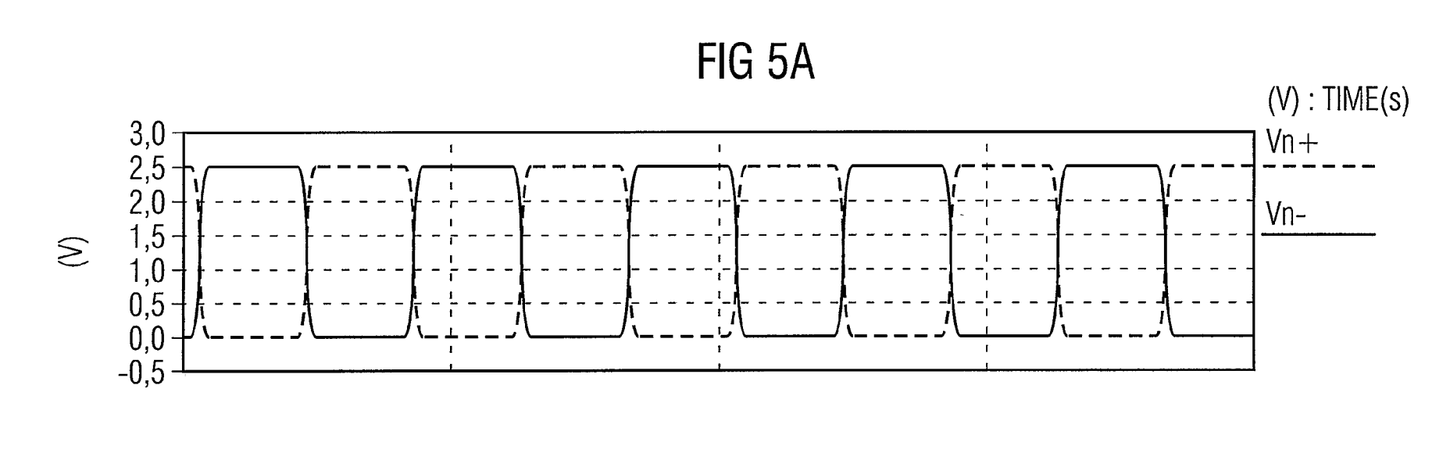
FIG. 5 is a plot of voltage versus time for the voltages at various points in the circuit of FIG. 4.

In this example, Vn+ switches regularly between high and low states and in this case forms a square wave as shown in FIG. 5(a). (Of course, Vn+ is just the signal to be transmitted with pre-emphasis so could have any digital pattern depending on the data to be transmitted.) This square wave signal is input to the delay block 405 as well as NMOS 411b. Although not shown in FIG. 5, Vp+ switches directly out of phase with Vn+. Vn− is also directly out of phase with Vn+ so is high when Vn+ is low and vice-versa. This square wave is also shown in FIG. 5(a). Although not shown in FIG. 5, Vp+ switches directly out of phase with Vn−. Thus, the inputs to delay block 405 (Vn+), PMOS 409b (Vp−) and NMOS 411b (Vn+) are switching between high, low, high . . . states while the inputs to PMOS 409a (Vp+) and NMOS 411a (Vn−) are switching between low, high, low . . . states.

Figure 5B:
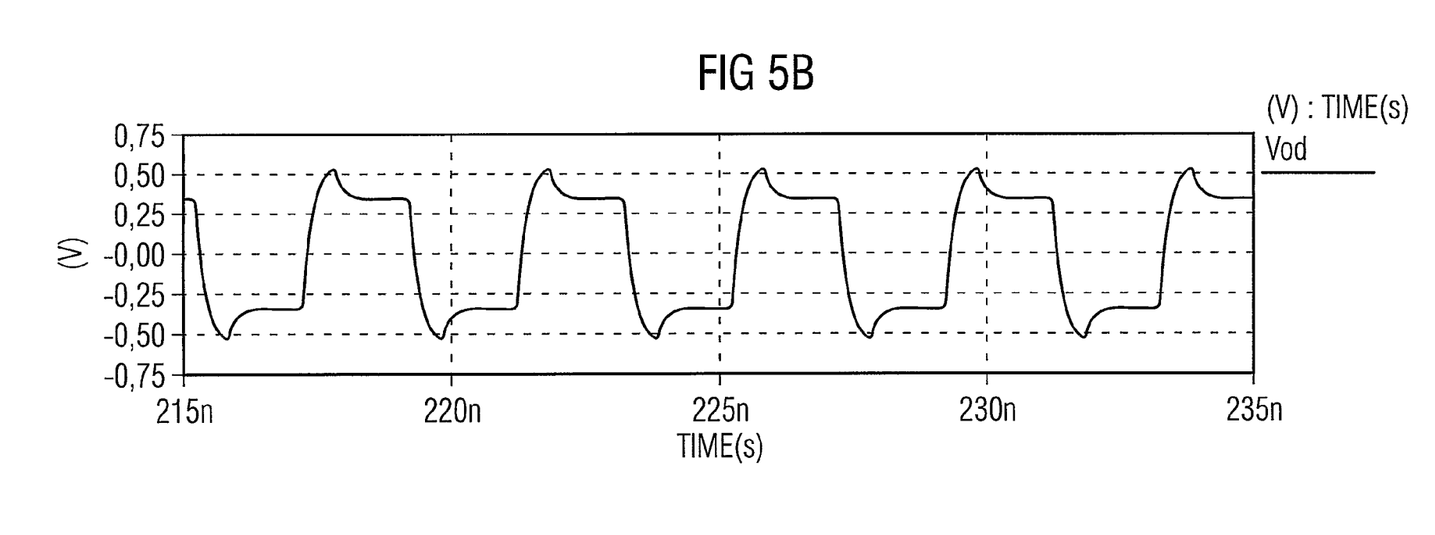
Figure 5C:
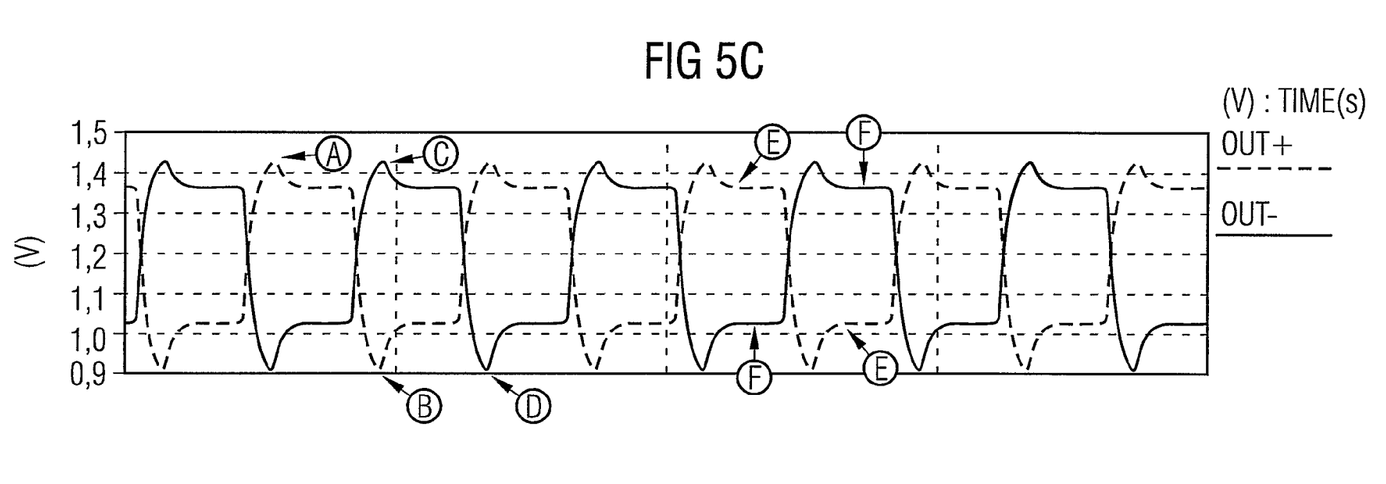
Figure 5D:
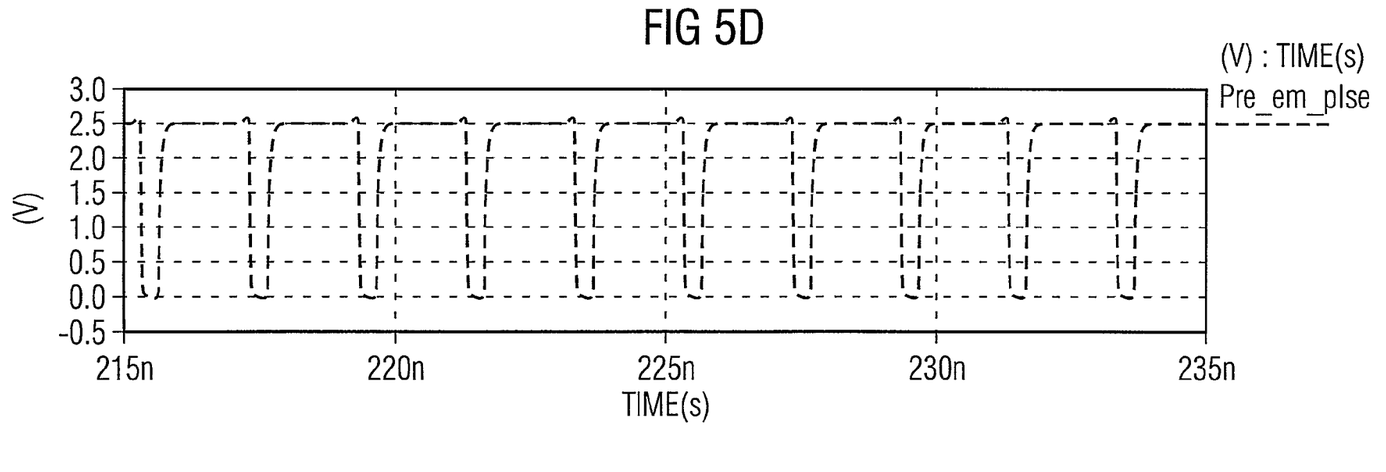

The switching of input Vn+ causes the output of XOR gate 415 (signal pre_em_plse) to have the form shown in FIG. 5(d). For a short time T1 after each switching transition of Vn+, signal pre_em_plse is low (at this time inputs A and B are the same) and for the remainder of each cycle, signal pre_em_plse is high (inputs A and B are different).

When signal pre_em_plse is low for time T1 after each transition, the resistors 403a and 403b are not switched on. Thus, the current passes entirely through branch A or entirely through branch B. When Vp++(and hence Vn−) is high, the entire current passes through 409a, $R_L$ and 411b. Thus, OUT+ is high (shown at A) and OUT− is lower (Shown at D) than OUT+. When Vp− (and hence Vn+) is high, the entire current passes through 409b, RL and 411a. Thus, Thus, OUT+ is low (shown at B) and OUT− is higher than OUT+ (shown at C).

When signal pre_em_plse returns to high for the rest of the cycle, this brings into effect resistors 403a and 403b. As described above, the current from current source 407 splits between branches A and B. This reduces the voltage drop between OUT+ and OUT− to less than during the pre-emphasis pulse.

Thus, immediately after each switching transition there is a voltage peak on OUT+ and OUT− (either in the positive or negative direction). This is associated with the brief pre-emphasis pulse so that resistors 403a and 403b are not effective. For the remainder of each cycle, the voltage magnitude is reduced because resistors 403a and 403b are now effective and the total current flowing through load resistor RL is reduced. The actual magnitude of the OUT+ and OUT− voltages can be controlled by changing the components 403a and 403b appropriately.

The output differential voltage $V_{OD}$ is the difference between the voltage OUT+ and the voltage OUT− and is shown in FIG. 5(b). It can be seen that the output differential voltage $V_{OD}$ corresponds to the input Vn+ but now includes pre-emphasis. Thus, the Vn+ will be more reliably transmitted as the pre-emphasis pulse after each switch will compensate for any signal degradation.

Thus, in the arrangement of the invention, the bias current in the driver stage is the same during the pre-emphasis and non-pre-emphasis periods. The differential voltage amplitude across the load resistance will be controlled by the difference of the two currents in the branches A and B respectively which are in turn controlled by the transition of the incoming data signal. This avoids the problems associated with prior art arrangements in which there is a lot of switching noise to the neighbouring bias circuitry.

The invention claimed is:

1. A Low Voltage Differential Signalling (LVDS) driver arranged to receive an input signal which switches between 1 and 0 voltage levels, the driver comprising:
   a pre-emphasis block for generating a pre-emphasis signal, the pre-emphasis signal having a first voltage level for a time period T1 after each switch of the input signal from 1 to 0 or from 0 to 1, and a second voltage level at all other times;
   a differential pair of outputs for generating a differential output voltage across a load resistor;
   a driver circuit comprising two parallel branches, each branch being connected to one output of the differential pair of outputs and each branch being arranged to receive the pre-emphasis signal, wherein the LVDS driver is arranged such that the total current flowing through the driver circuit is constant, and
   during time period T1, the total current flowing through the driver circuit flows through the load resistor, thereby producing the differential output voltage across the differential pair of outputs, and at all other times, only some of the total current flowing through the driver circuit flows through the load resistor, thereby reducing the differential output voltage across the differential pair of outputs.

2. The LVDS driver according to claim 1 wherein the pre-emphasis block comprises:
   a delay circuit arranged to receive the input signal and generate a delayed input signal; and
   a logic circuit coupled to the delay circuit and arranged to receive the input signal and the delayed input signal, the output of the logic circuit being the pre-emphasis signal having a first voltage level for a time period T1 after each switch of the input signal from 1 to 0 or from 0 to 1, and a second voltage level at all other times.

3. The LVDS driver according to claim 2, wherein the logic circuit comprises an exclusive-OR circuit.

4. The LVDS driver according to claim 3 wherein the delay circuit comprises a plurality of inverters.

5. The LVDS driver according to claim 4 wherein, during time period T1, the total current flowing through the driver circuit flows from the operational branch of the driver circuit, through the load resistor, to the non-operational branch of the driver circuit.

6. The LVDS driver according to claim 5, wherein the second resistive element in each branch is controlled by the pre-emphasis signal, such that, during T1, the second resistive element in each branch is switched off and, at all other times, the second resistive element in each branch is switched on.

7. The LVDS driver according to claim 5 wherein, at all other times, some of total current flowing through the driver circuit flows from the operational branch of the driver circuit, through the load resistor, to the non-operational branch of the driver circuit, and the remaining current flows through the non-operational branch of the driver circuit, bypassing the load resistor.

8. The LVDS driver according to claim 7, wherein one branch is operational when the input signal is 1 and the other branch is operational when the input signal is 0.

9. The LVDS driver according to claim 8 wherein each branch of the driver circuit comprises a first resistive element in parallel with a second resistive element.

10. The LVDS driver circuit according to 9, wherein each branch of the driver circuit comprises a third resistive element in series with the parallel first and second resistive elements.

11. The LVDS driver according to claim 10, wherein the driver circuit further comprises a constant current source coupled to a voltage supply.

12. A method for generating a differential output voltage corresponding to an input signal, which switches between 1 and 0 voltage levels, but including a pre-emphasis pulse after each switch of the input signal from 1 to 0 or from 0 to 1, the method comprising the steps of:

generating a pre-emphasis signal having a first voltage level for a time period T1 after each switch of the input signal from 1 to 0 or from 0 to 1, and a second voltage level at all other times;

providing a differential pair of outputs for generating the differential output voltage;

providing a driver circuit comprising two branches in parallel, each branch being connected to one output of the differential pair of outputs and each branch being arranged to receive the pre-emphasis signal;

controlling the current flowing through the driver circuit such that the total current flowing through the driver circuit is constant, and during time period T1, the total current flowing through the driver circuit flows through the load resistor, thereby producing the differential output voltage across the differential pair of outputs, and at all other times, only some of the total current flowing through the driver circuit flows through the load resistor, thereby reducing the differential output voltage across the differential pair of outputs;

outputting the differential output voltage on the differential pair of outputs, the differential output voltage corresponding to the input signal but including a pre-emphasis pulse after each switch of the input signal from 1 to 0 or from 0 to 1.

\* \* \* \* \*